United States Patent
Otto et al.

(10) Patent No.: US 11,430,917 B2
(45) Date of Patent: Aug. 30, 2022

(54) SEMICONDUCTOR COMPONENT COMPRISING A DEFORMATION LAYER AND METHOD FOR PRODUCING A SEMICONDUCTOR COMPONENT COMPRISING A DEFORMATION LAYER

(71) Applicant: Osram Opto Semiconductors GmbH, Regensburg (DE)

(72) Inventors: Isabel Otto, Regenstauf (DE); Anna Kasprzak-Zablocka, Donaustauf (DE); Christian Leirer, Friedberg (DE); Berthold Hahn, Hemau (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 289 days.

(21) Appl. No.: 16/615,835

(22) PCT Filed: May 17, 2018

(86) PCT No.: PCT/EP2018/062989
§ 371 (c)(1),
(2) Date: Nov. 22, 2019

(87) PCT Pub. No.: WO2018/215309
PCT Pub. Date: Nov. 29, 2018

(65) Prior Publication Data
US 2020/0168767 A1    May 28, 2020

(30) Foreign Application Priority Data
May 23, 2017    (DE) .................. 10 2017 111 278.2

(51) Int. Cl.
*H01L 33/40*    (2010.01)
*H01L 33/38*    (2010.01)
(Continued)

(52) U.S. Cl.
CPC ...... *H01L 33/382* (2013.01); *H01L 31/02161* (2013.01); *H01L 31/022408* (2013.01);
(Continued)

(58) Field of Classification Search
CPC ................................................ H01L 31/02161
See application file for complete search history.

(56) References Cited

U.S. PATENT DOCUMENTS

| 9,240,523 B2 | 1/2016 | Höpel |
| 2016/0027980 A1 | 1/2016 | Hahn et al. |

(Continued)

FOREIGN PATENT DOCUMENTS

| DE | 102015100578 A1 | 7/2016 |
| DE | 102015111492 A1 | 1/2017 |

(Continued)

OTHER PUBLICATIONS

Hoppel et al., WO 2016/113032 A1, published Jul. 21, 2016.*
(Continued)

*Primary Examiner* — Suberr L Chi
(74) *Attorney, Agent, or Firm* — Viering, Jentschura & Partner mbB

(57) ABSTRACT

A semiconductor component may include a semiconductor body having a first semiconductor layer and a second semiconductor layer, a first main face and a second main face, opposite from the first main face, the first main face being formed by a surface of the first semiconductor layer and the second main face being formed by a surface of the second semiconductor layer. At least one side face may join the first main face to the second main face, an electrically conducting carrier layer, which covers the second main face at least in certain regions and extends from the second main face to at least one side face of the semiconductor body. An electrically conducting continuous deformation layer may
(Continued)

cover the second main face at least in certain regions. The electrically conducting deformation layer may have an elasticity that is identical to or higher than the electrically conducting carrier layer.

14 Claims, 5 Drawing Sheets

(51) Int. Cl.
*H01L 33/00* (2010.01)
*H01L 31/0216* (2014.01)
*H01L 31/0224* (2006.01)
*H01L 33/32* (2010.01)

(52) U.S. Cl.
CPC .......... *H01L 33/0093* (2020.05); *H01L 33/40* (2013.01); *H01L 33/32* (2013.01); *H01L 2933/0016* (2013.01)

(56) References Cited

U.S. PATENT DOCUMENTS

| 2017/0077367 A1* | 3/2017 | Shimojuku | ............. H01L 33/44 |
| 2017/0084869 A1* | 3/2017 | Wang | .................. H01L 51/5237 |
| 2017/0133566 A1 | 5/2017 | Herrmann | |
| 2018/0212121 A1 | 7/2018 | Leirer et al. | |
| 2018/0358512 A1 | 12/2018 | Hoeppel et al. | |

FOREIGN PATENT DOCUMENTS

| DE | 102015114583 A1 | 3/2017 |
| WO | 2014161738 A1 | 10/2014 |
| WO | 2015140159 A1 | 9/2015 |

OTHER PUBLICATIONS

International Search Report for corresponding Patent Application PCT/EP2018/062989, dated Aug. 24, 2018, 14 pages (for reference purpose only).

German search Report issued for corresponding German patent application 10 2017 111 278.2, dated Dec. 19, 2017, 8 pages (for reference purpose only).

German Search Report issued for corresponding DE patent application No. 10 2017 111 278.2, dated Dec. 23, 2021, 7 pages (for informational purposes only).

* cited by examiner

SEMICONDUCTOR COMPONENT COMPRISING A DEFORMATION LAYER AND METHOD FOR PRODUCING A SEMICONDUCTOR COMPONENT COMPRISING A DEFORMATION LAYER

CROSS-REFERENCE TO RELATED APPLICATIONS

The present application is a national stage entry according to 35 U.S.C. § 371 of PCT application No.: PCT/EP2018/062989 filed on May 17, 2018; which claims priority to German Patent Application Serial No.: 10 2017 111 278.2, which was filed on May 23, 2017; both of which are incorporated herein by reference in their entirety and for all purposes.

TECHNICAL FIELD

A semiconductor component and a method for producing a semiconductor component are provided.

BACKGROUND

In semiconductor components, defects, for example cracks or delaminations, may occur under mechanical loads because of comparatively poor deformability of some layers of material and can spread and impair the quality of the semiconductor components.

SUMMARY

One object to be achieved in the present case is that of providing a mechanically stable semiconductor component. Another object to be achieved is that of providing a method for producing such a semiconductor component.

According to at least one embodiment, the semiconductor component includes a semiconductor body, which has a first semiconductor layer and a second semiconductor layer. Furthermore, the semiconductor body has a first main face and a second main face, opposite from the first main face, in particular the first main face being formed by a surface of the first semiconductor layer and the second main face being formed by a surface of the second semiconductor layer.

In particular, the first main face and the second main face delimit the semiconductor body in a vertical direction.

Furthermore, the semiconductor body has at least one side face, which joins the first main face to the second main face. The number of side faces is determined by the geometry of the semiconductor body. In particular, the semiconductor body has multiple side faces. This is the case for example when the semiconductor chip is of a cuboidal form and correspondingly has four side faces. The at least one side face is arranged largely transversely to the first and second main faces. "Transversely" means that a normal vector of the side face does not run parallel to a normal vector of the first and/or second main faces. In a non-limiting embodiment, the at least one side face delimits the semiconductor body in one or more lateral directions. The lateral directions are arranged in a plane of which the normal vector is arranged parallel to the vertical direction. In particular, the direction in which the second semiconductor layer follows the first semiconductor layer is referred to as the vertical direction.

Furthermore, the at least one side face may be a face that is made up of at least two sub-faces. For example, the sub-faces may be planar faces, in particular the surface normals of two sub-faces that are adjacent to one another running transversely, that is to say not parallel, to one another.

The first semiconductor layer may have a first conductivity and the second semiconductor layer may have a second conductivity. In a non-limiting embodiment, the first semiconductor layer is an n-conducting layer. Furthermore, the second semiconductor layer is in particular a p-conducting layer. The semiconductor body may have further semiconductor layers between the first and second semiconductor layers.

According to at least one embodiment, in the present case the semiconductor component is an optoelectronic component. Here, the semiconductor body has an active zone, which is suitable for radiation generation or for radiation detection. In particular, the active zone is a p-n junction zone. The active zone may in this case be formed as one layer or as a series of multiple layers. For example, during the operation of the semiconductor component the active zone emits electromagnetic radiation, for instance in the visible, ultraviolet or infrared spectral range. Alternatively, during the operation of the semiconductor component the active zone may absorb electromagnetic radiation and convert it into electrical signals or electrical energy. The active zone is in particular arranged between the first semiconductor layer and the second semiconductor layer.

Materials based on nitride-compound semiconductors come into consideration for the layers of the semiconductor body. "Based on nitride-compound semiconductors" means in the present context that at least one layer of the semiconductor body includes a nitride-III/V compound semiconductor material, such as $Al_nGa_mIn_{1-n-m}N$, where $0 \leq n \leq 1$, $0 \leq m \leq 1$ and $n+m \leq 1$. This material does not in this case necessarily have to have a mathematically exact composition in accordance with the above formula. Rather, it may include one or more dopants as well as additional constituents that do not substantially change the characteristic physical properties of the $Al_nGa_mIn_{1-n-m}N$ material. For the sake of simplicity, however, the above formula only includes the essential constituents of the crystal lattice (Al, Ga, In, N), even if they can to some extent be substituted by small amounts of further substances.

Furthermore, the semiconductor component may have an electrically conducting carrier layer. The carrier layer has in this case a comparatively low electrical resistance. In addition, because of its nature, for example its thickness and/or its material, the carrier layer is a stabilizing component of the semiconductor component.

In non-limiting embodiments, the second main face is covered at least in certain regions by the carrier layer. It is in this case possible that the carrier layer is for the greater part formed without any interruption, so that the second main face is covered to at least 50%, in particular to at least 80%, with preference to at least 90%, by the carrier layer. The carrier layer therefore has in particular only a few locations at which there are interruptions, that is to say regions of reduced thickness. Furthermore, the semiconductor component may have an electrically conducting deformation layer. The deformation layer has in this case a comparatively low electrical resistance. In particular, the electrically conducting deformation layer has an elasticity that is identical to or higher than the electrically conducting carrier layer. In this case, the "elasticity" refers in particular to the elastic properties of the material used for the various layers. Furthermore, the stiffness of the deformation layer differs from the stiffness of the carrier layer. In particular, the stiffness of the carrier layer is higher than the stiffness of the deformation layer. The "stiffness" describes the resistance of a body to elastic deformation due to a force or a moment, for example a bending moment or a torsional moment. The stiffness of a layer depends not only on the elastic properties of the material used, but also decisively on the geometry of the layer.

In non-limiting embodiments, the second main face is covered at least in certain regions by the electrically conducting deformation layer. It is in this case possible that the deformation layer covers the second main face to 70%, in particular to at least 80%, with preference to at least 90%. The deformation layer may for the greater part be formed without any interruption. The deformation layer therefore has in particular only a few locations at which there are interruptions, that is to say regions of reduced thickness. It is however also conceivable that the deformation layer is structured, so that the degree of coverage of the second main face by the deformation layer is less than 70%, in particular however greater than 30%. A structuring of the deformation layer can have the effect in particular that the stiffness of the deformation layer is reduced.

According to at least one embodiment, the deformation layer is a continuous layer. This means that all of the regions of the deformation layer are connected to one another.

By means of the deformation layer, which is in particular less stiff and more elastic than the carrier layer, mechanical loads that possibly occur during the production or assembly of the semiconductor component and lead to defects, such as for instance cracks or delaminations, in the semiconductor component can be absorbed. The more compliant deformation layer therefore compensates for the rigidity of the carrier layer.

According to at least one embodiment, the deformation layer is arranged on a side of the carrier layer that is facing away from the semiconductor body. In particular, the deformation layer is applied directly to the carrier layer. Therefore, no further layer is arranged between the carrier layer and the deformation layer. Stresses occurring in the region of the carrier layer can consequently be advantageously reduced by the deformation layer arranged in the direct proximity.

In non-limiting embodiments, the carrier layer is conformally covered by the deformation layer. This means in particular that delimiting areas of the carrier layer and the deformation layer that are facing one another are identical with respect to their geometrical shape.

According to at least one embodiment, the deformation layer is made thinner than the carrier layer. A thickness of the deformation layer may be half or less than half the thickness of the carrier layer. For example, the thickness of the deformation layer may be between approximately 200 nm and approximately 5 μm, deviations from the values specified of up to 10% being tolerable. Furthermore, the thickness of the carrier layer may be between 2 μm and 100 μm inclusive, in particular between 5 μm and 30 μm, such as between 5 μm and 15 μm, deviations from the values specified of up to 10% being tolerable. The thickness is a maximum extent of the respective layer in a direction that is arranged perpendicularly to a main plane of extent of the respective layer.

The deformation layer is predominantly a layer of uniform thickness, it being possible for the thickness to vary within customary production tolerances. The deformation layer in particular strengthens the carrier layer and, in combination with the latter, may contribute to stabilizing the semiconductor component.

In the case of a refinement, the carrier layer and the deformation layer are formed from different materials. In particular, here the deformation layer has a greater elasticity than the carrier layer. Alternatively, the carrier layer and the deformation layer may be formed from the same material, the electrically conducting deformation layer having an equally great elasticity as the electrically conducting carrier layer. If the deformation layer and the carrier layer are formed from the same material, a material with comparatively great elasticity is used.

According to at least one embodiment, the deformation layer is a metallic layer. A "metallic layer" should be understood in this case as meaning a layer that is formed by a metal or metal compound and is distinguished by at least one of the following properties: high electrical conductivity, which decreases with increasing temperature, high thermal conductivity, ductility (deformability), metallic gloss (mirror finish). The carrier layer is also a metallic layer.

Suitable materials for the deformation layer are for example Au, In and Cu. The deformation layer may contain at least one of these materials or consist of one of these materials. For example, Au, Zn, Al, Sn, Ni and Cu or compounds of these materials, such as for example AuSn and NiAu and additionally NiPdAu, come into consideration as materials for the carrier layer. The carrier layer may therefore contain at least one of these materials or consist of one of these materials.

The deformation layer may be a galvanic, sputtered or vapor-deposited layer. The deformation layer is in particular galvanically deposited on the carrier layer or sputtered or vapor-deposited on the carrier layer. The carrier layer is in particular a galvanic layer, which is galvanically deposited on a starting layer (seed layer) arranged on the semiconductor body. For example, the starting layer may contain one of the materials Au, Cu, Ti, Al, Ag, Sn, Rh, Ni or Pt or consist of one of these materials.

In the case of a refinement, the carrier layer extends from the second main face to at least one side face of the semiconductor body. In particular, the carrier layer may extend to at least one side face of the first semiconductor layer. In this case, side faces of the second semiconductor layer may be completely covered by the carrier layer.

In the case of a refinement, the deformation layer extends in lateral directions to an edge of the carrier layer. In this case, the deformation layer may project beyond the semiconductor body in lateral directions.

Furthermore, at least one side face of the semiconductor component is formed in certain regions by side faces of the carrier layer and the deformation layer. In particular, a number of the side faces of the semiconductor component are formed in certain regions by side faces of the carrier layer and the deformation layer. The semiconductor component is thus at least partially laterally delimited by side faces of both layers.

According to at least one embodiment of the semiconductor component, the semiconductor body has at least one recess, which extends from the second main face in the direction of the first main face and ends in the first semiconductor layer. The recess is for example surrounded by the semiconductor body around the full periphery. The semiconductor body may have a plurality of such recesses. In non-limiting embodiments, the carrier layer is arranged in the at least one recess. This advantageously serves for the electrical contacting of the first semiconductor layer, to be specific from the side of the second main face.

According to at least one embodiment, the semiconductor component has on the side of the second main face a first terminal contact for the electrical contacting of the first semiconductor layer and a second terminal contact for the electrical contacting of the second semiconductor layer. In this case, the first terminal contact may be connected in an electrically conducting manner to the carrier layer. Furthermore, the second terminal contact may be connected in an electrically conducting manner to a terminal layer, which is connected in an electrically conducting manner to the second semiconductor layer.

In the case of a refinement, the deformation layer has at least one recess, in which the second terminal contact is arranged. In particular, the recess extends from a delimiting area of the deformation layer that is facing away from the carrier layer through the deformation layer to a delimiting area of the deformation layer that is facing the carrier layer. That is to say that the deformation layer is completely penetrated by the recess. Furthermore, the recess may continue into the carrier layer and completely penetrate it.

According to at least one embodiment, the semiconductor component has a molded-on main body, which is arranged on the semiconductor body. In the vertical direction, the deformation layer is arranged between the semiconductor body and the main body. In non-limiting embodiments, the first and second terminal contacts are embedded in the main body. In this case, the first and second terminal contacts extend in particular from the side of the semiconductor body through the main body to a surface of the main body that is facing away from the semiconductor body.

The main body may for example be formed by a molding process. In particular, the main body is produced from a moldable plastic, for instance a polymer such as resin, epoxy or silicone. Advantageously, the plastics material of the main body may be protected by the carrier layer that is arranged between the semiconductor body and the main body from the electromagnetic radiation of the semiconductor body, which for example leads to accelerated aging of the main body. A molding process is generally understood as meaning a process by which a molding compound is shaped according to a prescribed form, with preference under the effect of pressure, and if required is cured. In particular, the term "molding process" includes molding, film assisted molding, injection molding, transfer molding and compression molding.

According to at least one embodiment of a method for producing a semiconductor component, it has the following steps:
  providing a semiconductor body having
    a first semiconductor layer and a second semiconductor layer,
    a first main face and a second main face, opposite from the first main face, the first main face being formed by a surface of the first semiconductor layer and the second main face being formed by a surface of the second semiconductor layer,
    at least one side face, which joins the first main face to the second main face,
  applying an electrically conducting carrier layer to the second main face,
  applying an electrically conducting deformation layer to the second main face, the electrically conducting deformation layer having an elasticity that is identical to or higher than the electrically conducting carrier layer.

In non-limiting embodiments, the aforementioned method steps are carried out in the specified sequence.

According to at least one embodiment, the deformation layer is applied to the carrier layer on a side thereof that is facing away from the semiconductor body. In particular, the deformation layer is applied directly to the carrier layer. In this case, the deformation layer may be applied to the carrier layer by means of a coating process, with preference by means of a galvanic coating process. It is however also possible that the deformation layer is sputtered or vapor-deposited on the carrier layer. Furthermore, the carrier layer may be applied to a starting layer arranged on the semiconductor body by means of a coating process, with preference by means of a galvanic coating process. The starting layer may for example be a layer which is sputtered on or vapor-deposited.

In the case of a refinement, in addition the terminal contacts are applied to the semiconductor body by means of a coating process, with preference by means of a galvanic coating process. In this case, a further starting layer, which is in particular sputtered on or vapor-deposited, may serve as the seed layer for the terminal contacts. For example, the further starting layer may contain one of the materials Au, Ti, Cu, Al, Ag, Sn, Rh, Ni or Pt or consist of one of these materials.

The first and second semiconductor layers may be produced layer by layer one after the other on a growth substrate by means of an epitaxial process. Sapphire, SiC and/or GaN for example come into consideration as materials for the growth substrate. The growth substrate may be at least partially removed after the production of the semiconductor body, so that the first main face or a surface of the first semiconductor layer is at least partially exposed. For the stripping away of the growth substrate on which the first and second semiconductor layers are arranged, a laser lifting method comes into consideration for example. In this case, pressure waves or mechanical loads may be produced in the semiconductor body, and these can be advantageously reduced as a result of the deformability of the deformation layer. In this way it is possible to suppress the occurrence of defects.

For producing a plurality of semiconductor components, a wafer assemblage may be provided, having a series of semiconductor layers including a first semiconductor layer and a second semiconductor layer, a plurality of first terminal contacts, a plurality of second terminal contacts and at least one or a plurality of continuous carrier layer(s) as well as at least one or a plurality of continuous deformation layer(s). The wafer assemblage may have a plurality of separating trenches, along which the wafer assemblage can be divided up into a plurality of semiconductor components. A complete penetration of the series of semiconductor layers by the separating trenches is not necessary here. Rather, the separating trenches may extend through the second semiconductor layer and the active layer into the first semiconductor layer and end there.

Alternatively, it is also possible that the separating trenches extend in the vertical direction through the entire wafer assemblage, so that separate semiconductor bodies or semiconductor components are already produced by the formation of the separating trenches. This variant is advantageous in particular when the semiconductor bodies are to be covered at the side faces with a material, for example with a reflective material.

According to at least one embodiment of a method for producing one or a plurality of the semiconductor components described here, a main body assemblage is molded onto the wafer assemblage. For forming the main body assemblage, a material suitable for it is applied to the wafer assemblage in such a way that the separating trenches and intermediate regions between the terminal contacts are at least partially or completely filled. In a subsequent method step, the wafer assemblage and the main body assemblage are singulated along the separating trenches into a plurality of semiconductor components in such a way that the semiconductor components have in each case a semiconductor body, a carrier layer, a deformation layer and a main body, a first terminal contact and a second terminal contact being embedded in the main body.

The method described above is particularly suitable for the production of one or a plurality of the semiconductor components described here. Therefore, features described in connection with the semiconductor component can also be used for the method, and vice versa.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the illumination apparatus. In the following description, various aspects are described with reference to the following drawings, in which.

DETAILED DESCRIPTION

Figure 1A:
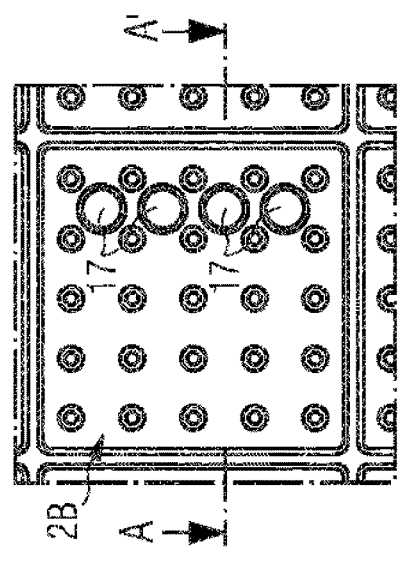
FIG. 1A shows a schematic plan view and FIG. 1B shows a schematic cross-sectional view of a method step and of a semiconductor component in an intermediate stage of a method according to an embodiment.
Figure 1B:
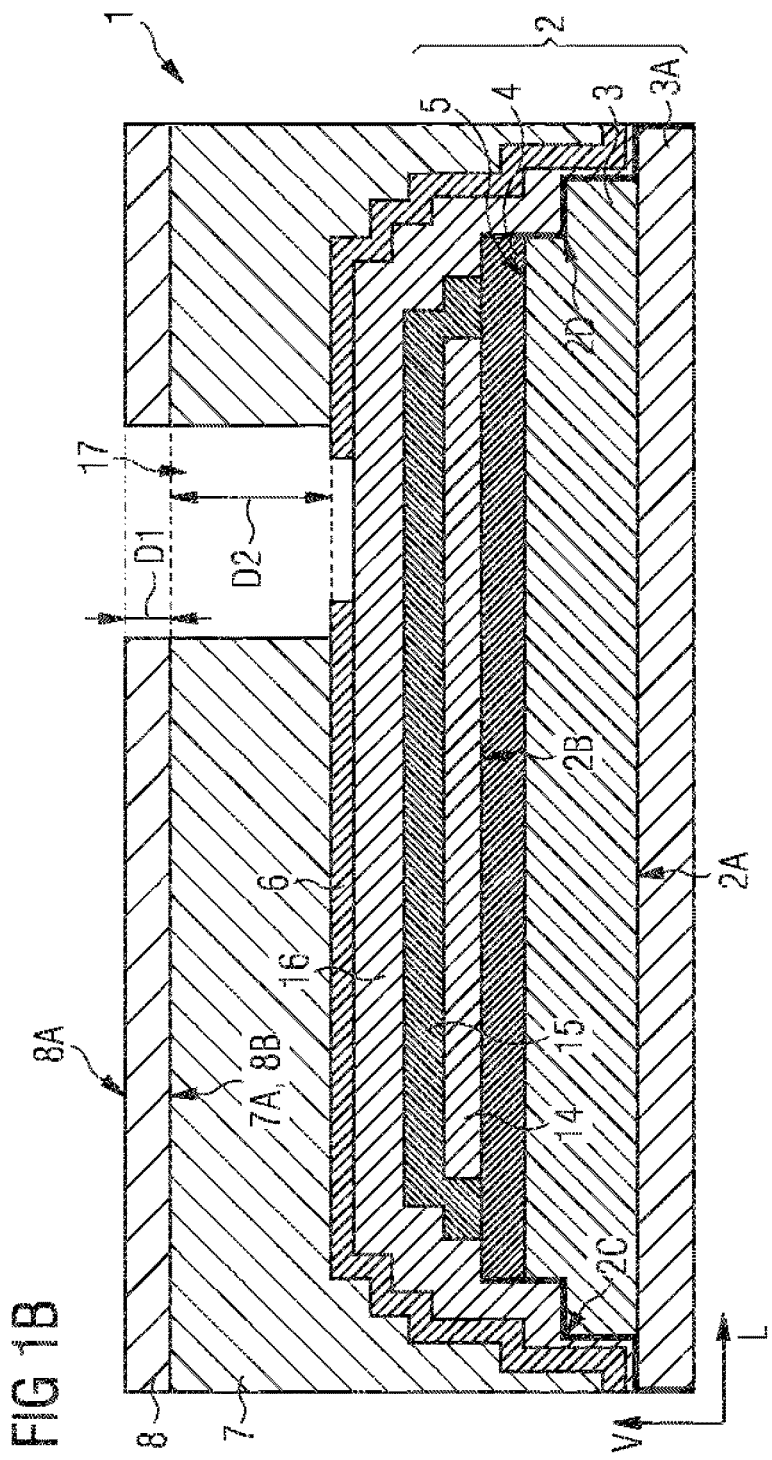

FIGS. 1A and 1B illustrate an intermediate stage of a method for producing a semiconductor component 1 and an intermediate stage of a semiconductor component 1 described in the present case. FIG. 1A shows the unfinished semiconductor component 1 in a plan view of a second main face 2B of the semiconductor body 2. FIG. 1B shows a cross section of the unfinished semiconductor component 1 along the line AA' represented in FIG. 1A.

The unfinished semiconductor component 1 includes a semiconductor body 2 with a first semiconductor layer 3, a second semiconductor layer 4 and a growth substrate 3A, on which the first and second semiconductor layers 3, 4 are arranged. Furthermore, the semiconductor body 2 has a first main face 2A and a second main face 2B, opposite from the first main face 2A, the first main face 2A being formed by a surface of the first semiconductor layer 3 and the second main face 2B being formed by a surface of the second semiconductor layer 4. In addition, the semiconductor body 2 has multiple side faces 2C, 2D, which join the first main face 2A to the second main face 2B. In particular, the first main face 2A and the second main face 2B delimit the semiconductor body 2 in the finished semiconductor component (cf. FIG. 3) in a vertical direction V, while the side faces 2C, 2D delimit the semiconductor body 2 in lateral directions L. The lateral directions L in this case run transversely, in particular perpendicularly, to the vertical direction V. The side faces 2C, 2D may be made up in each case of multiple sub-faces, in particular the individual sub-faces being in each case planar surfaces and the surface normals of two sub-faces that are adjacent to one another running transversely, that is to say not parallel, to one another.

Between the first semiconductor layer 3 and the second semiconductor layer 4, the semiconductor body 2 has an active zone 5, which is intended for radiation generation. In particular, the active zone 5 is a p-n junction zone. The active zone 5 may in this case be formed as one layer or as a series of multiple layers.

The first semiconductor layer 3 may have a first conductivity and the second semiconductor layer 4 may have a second conductivity. In non-limiting embodiments, the first semiconductor layer 3 is an n-conducting layer. Furthermore, the second semiconductor layer 4 is in particular a p-conducting layer.

Materials based on nitride-compound semiconductors come into consideration for the layers of the semiconductor body 2.

The semiconductor component 1 includes an electrically conducting carrier layer 7, which covers the second main face 2B and the side faces 2C, 2D of the semiconductor body 2 at least in certain regions. In this case, the carrier layer 7 extends from the second main face 2B over side faces of the second semiconductor layer 4 to side faces of the first semiconductor layer 3.

Furthermore, the semiconductor component 1 includes an electrically conducting deformation layer 8, which is arranged on a side of the carrier layer 7 that is facing away from the semiconductor body 2. The electrically conducting deformation layer 8 covers the second main face 2B at least in certain regions. Furthermore, the electrically conducting deformation layer 8 covers a delimiting area 7A of the carrier layer 7 that is facing it. The carrier layer 7 is in particular covered conformally by the deformation layer 8. This means in particular that delimiting areas 7A, 8B of the carrier layer 7 and the deformation layer 8 that are facing one another are identical with respect to their geometrical shape. The deformation layer 8 is applied directly to the carrier layer 7, so that there is no further layer between the carrier layer 7 the deformation layer 8.

In the case of the embodiment represented, the deformation layer 8 is made thinner than the carrier layer 7. In particular, the deformation layer 8 is at most made half as thick as the carrier layer 7. For example, the thickness D1 of the deformation layer 8 is between approximately 200 nm and approximately 5 µm, deviations from the values specified of up to 10% being tolerable. Furthermore, the thickness D2 of the carrier layer 7 may be between 2 µm and 100 µm inclusive, in particular between 5 µm and 30 µm, such as between 5 µm and 15 µm, deviations from the values specified of up to 10% being tolerable. The thickness D2 of the carrier layer 8 is in this case determined perpendicularly to a main plane of extent, that is to say parallel to the vertical direction V. The deformation layer 8 may strengthen the carrier layer 7 and, in combination with the latter, contribute to stabilizing the semiconductor component 1.

The deformation layer 8 is predominantly formed with a uniform thickness D1, it being possible for the thickness D1 to vary within customary production tolerances. The deformation layer 8 is for the greater part formed without any interruption, so that the second main face 2B is covered by the deformation layer 8 to at least 70%, in particular to at least 80%, with preference to at least 90%. The deformation layer 8 therefore has in particular only a few locations at which there are interruptions, that is to say regions of reduced thickness.

The carrier layer 7 extends from the second main face 2B to side faces of the semiconductor body 2. Furthermore, the deformation layer 8 extends in lateral directions L to an edge of the carrier layer 7. In this case, the deformation layer 8 extends in lateral directions L over the semiconductor body 2.

The carrier layer 7 and the deformation layer 8 are formed in particular from different materials. Here, the deformation layer 8 advantageously has a greater elasticity than the carrier layer 7. Suitable materials for the deformation layer 8 are for example Au, In and Cu. The deformation layer 8 may contain at least one of these materials or consist of one of these materials.

For example, Au, Zn, Al, Sn, Ni and Cu or compounds of these materials, such as for example AuSn and NiAu and additionally NiPdAu, come into consideration as materials for the carrier layer 7. The carrier layer 7 may therefore contain at least one of these materials or consist of one of these materials.

The deformation layer 8 may be a galvanic, sputtered or vapor-deposited layer. The carrier layer 7 is in particular a galvanic layer, which is galvanically deposited on a starting layer 6 arranged on the semiconductor body 2.

Between the starting layer 6 and the semiconductor body 2, the semiconductor component 1 may have further layers. For example, a terminal layer 14, which directly adjoins the second semiconductor layer 4, may be provided. With preference, the terminal layer 14 is formed from an electrically conducting and highly reflective material. For example, the terminal layer 14 is an electrically conducting mirror layer. For example, the terminal layer 14 may contain Ag or consist thereof. However, it is also possible that the terminal layer 14 is formed from a transparent conducting oxide (transparent conductive oxides, "TCO" for short), such as for example zinc oxide.

Furthermore, a current spreading layer 15 may be arranged adjacent to the terminal layer 14. The current spreading layer 15 may be formed as a stack of layers including multiple metal layers. In particular, the current spreading layer 15 may include metals such as Pt, Au, Cu, Al, Ag, Sn, Rh and Ti.

In addition, a passivating layer 16 may be provided between the starting layer 6 and the semiconductor body 2. The passivating layer 16 may in this case cover the semiconductor body 2, the terminal layer 14 and the current spreading layer 15 in certain regions, in particular completely.

In the case of the embodiment represented, the deformation layer 8 has a number of recesses 17, in which a second terminal contact can in each case be arranged. In particular, the recesses 17 extend in each case from a delimiting area 8A of the deformation layer 8 that is facing away from the carrier layer 7 through the deformation layer 8 to a delimiting area 8B of the deformation layer 8 that is facing the carrier layer 7. That is to say that the deformation layer 8 is completely penetrated in the vertical direction by the recess 17. Furthermore, the recess 17 continues into the carrier layer 7 and completely penetrates it.

Figure 2A:
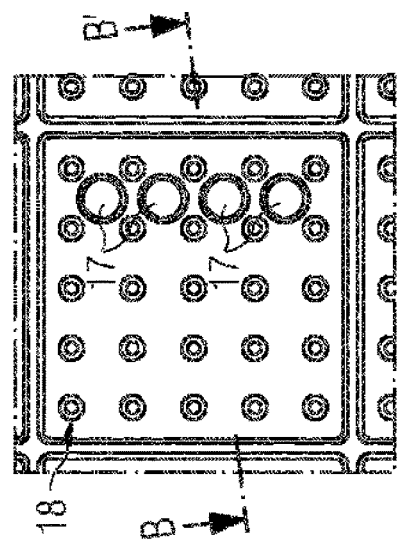
FIG. 2A shows a schematic plan view and FIG. 2B shows a further schematic cross-sectional view of the method step and of the semiconductor component in the intermediate stage of the method according to the embodiment.
Figure 2B:
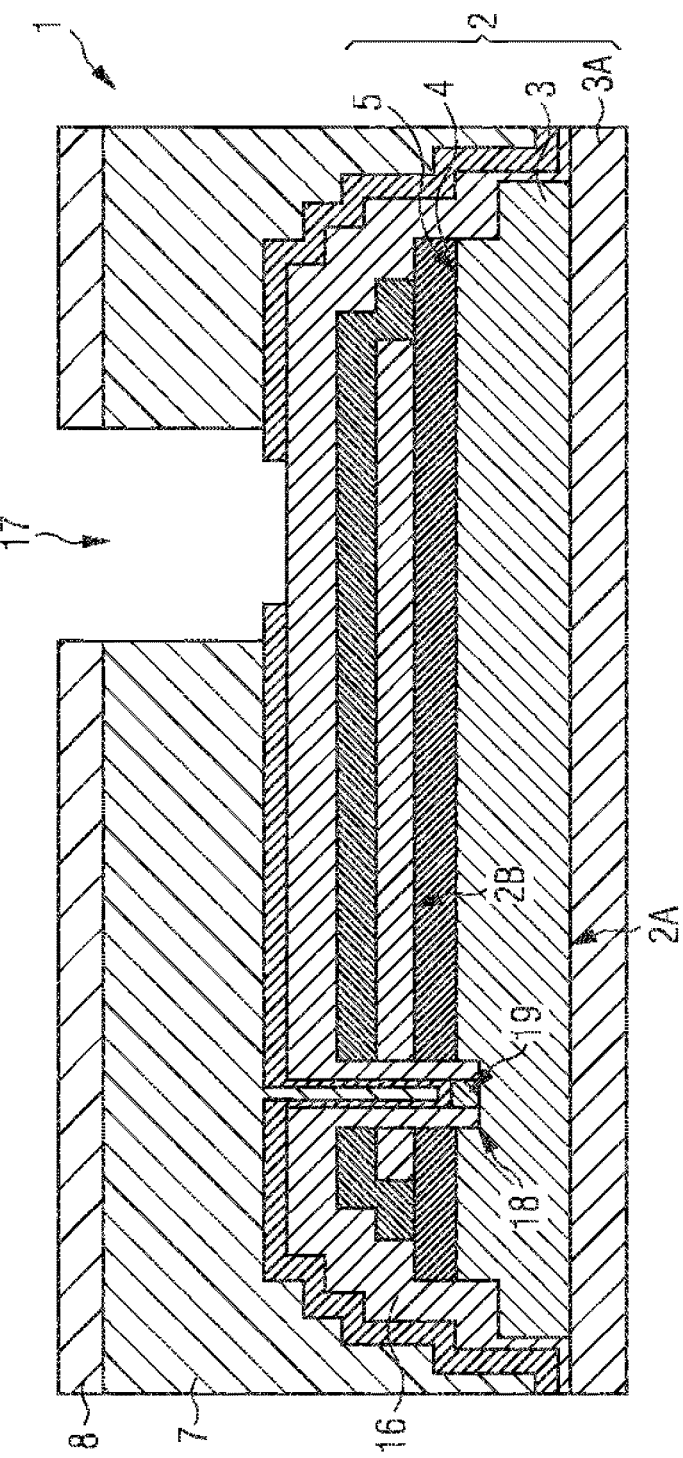

FIG. 2B shows the intermediate stage described above of a method and of a semiconductor component 1 in another view, a cross section along the line BB' that is represented in FIG. 2A being shown in FIG. 2B.

The semiconductor body 2 has a recess 18, which extends from the second main face 2B in the direction of the first main face 2A and ends in the first semiconductor layer 3. The recess 18 is surrounded in lateral directions around the full periphery by the semiconductor body 2. As can be seen from FIG. 2A, the semiconductor body 2 has a plurality of such recesses 18. In the recess 18, the carrier layer 7 is arranged. This advantageously serves for the electrical contacting of the first semiconductor layer 3 from the side of the second main face 2B. For improved electrical contacting of the first semiconductor layer 3, a contact element 19 may be arranged in direct contact with it in the recess 18. The carrier layer 7 arranged in the recess 18 is electrically insulated from the adjacent layers by an insulation laterally surrounding it. For example, the passivating layer 16 extends into the recess 18 and therefore provides electrical insulation for the carrier layer 7 with respect to the adjacent layers.

Between the intermediate stage, described in connection with FIGS. 1 and 2, and the final stage, represented in FIG. 3, of a method and of a semiconductor component 1, further method steps are performed.

On the one hand, an insulating layer 12 is formed on a delimiting area 8A of the deformation layer 8 that is facing away from the carrier layer 7, the insulating layer 12 extending into the recess 17. On the other hand, terminal contacts 10, 11 are formed. In this case, a further starting layer 9, which is in particular sputtered on, may serve as the seed layer for the terminal contacts 10, 11. In addition, a main body 13, into which the terminal contacts 10, 11 are embedded, is molded on. The main body 13 advantageously represents a further stabilizing component. The growth substrate 3A may be at least partially removed, so that the first main face 2A or a surface of the first semiconductor layer 3 is at least partially exposed. For the stripping away of the growth substrate 3A, a laser lifting process comes into consideration for example. The pressure waves or mechanical loads thereby occurring can be advantageously reduced by the elastic, compliant deformation layer 8.

Figure 3:
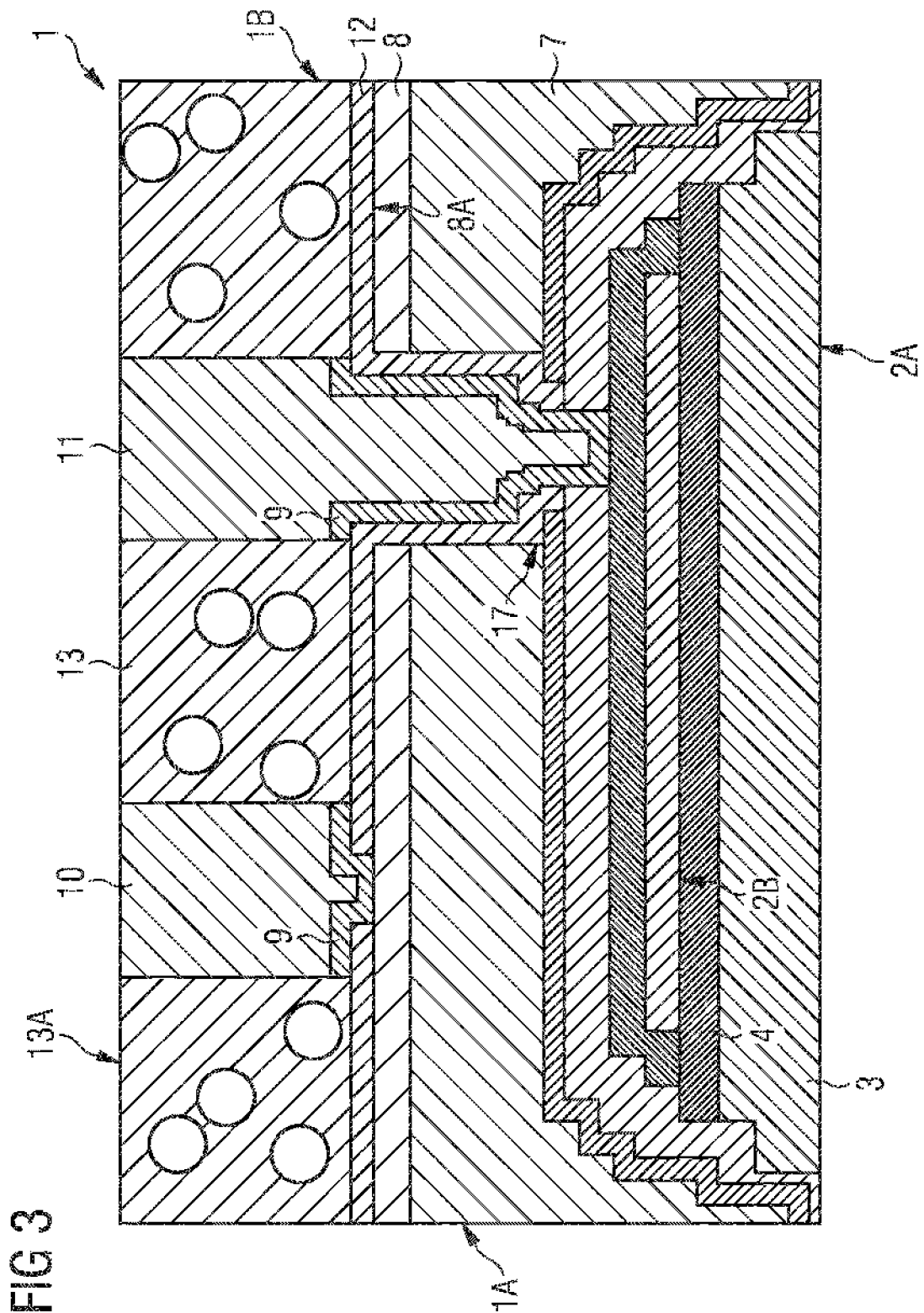
FIG. 3 shows a schematic cross-sectional view of a method step and of a semiconductor component in a final stage of the method according to the embodiment.

FIG. 3 shows a finished semiconductor component 1 in a cross-sectional view along the line AA' represented in FIG. 1A. The semiconductor component 1 is in particular an optoelectronic semiconductor component. The semiconductor component 1 is intended for the emission of radiation. In this case, during the operation of the semiconductor component 1 the active zone 5 can emit electromagnetic radiation, for instance in the visible, ultraviolet or infrared spectral range. In particular, the electromagnetic radiation is predominantly coupled out of the semiconductor component 1 at the first main face 2A'.

The semiconductor component 1 has a first terminal contact 10 for the electrical contacting of the first semiconductor layer 3 and a second terminal contact 11 for the electrical contacting of the second semiconductor layer 4. In this case, the first terminal contact 10 is in electrical contact with the carrier layer 7. Furthermore, the second terminal contact 11 is arranged in the recess 17 and extends in the vertical direction V through the deformation layer 8 and the carrier layer 7, the second terminal contact 11 being in electrical contact with the terminal layer 14. The second terminal contact 11 is electrically insulated from the deformation layer 8 and the carrier layer 7 by the insulating layer 12 arranged in the recess 18. The insulating layer 12 may be formed from an electrically insulating material, such as silicon oxide and/or silicon nitride.

Furthermore, the semiconductor component 1 has a molded-on main body 13, which is arranged on the semiconductor body 2. In the vertical direction V, the carrier layer 7 and the deformation layer 8 are arranged between the semiconductor body 2 and the main body 13. The first and second terminal contacts 10, 11 extend from the semiconductor body 2 through the main body 13 to a surface 13A of the main body 13 which is arranged on a side of the main body 13 that is facing away from the second main face 2B. The terminal contacts 10, 11 are enclosed in lateral directions L around the full periphery by the main body 13.

In the case of the embodiment represented, side faces 1A, 1B of the semiconductor component 1 are formed in certain regions by side faces of the carrier layer 7 and of the deformation layer 8. The semiconductor component 1 is therefore partially delimited in lateral directions L by side faces of both layers 7, 8.

Figure 4:
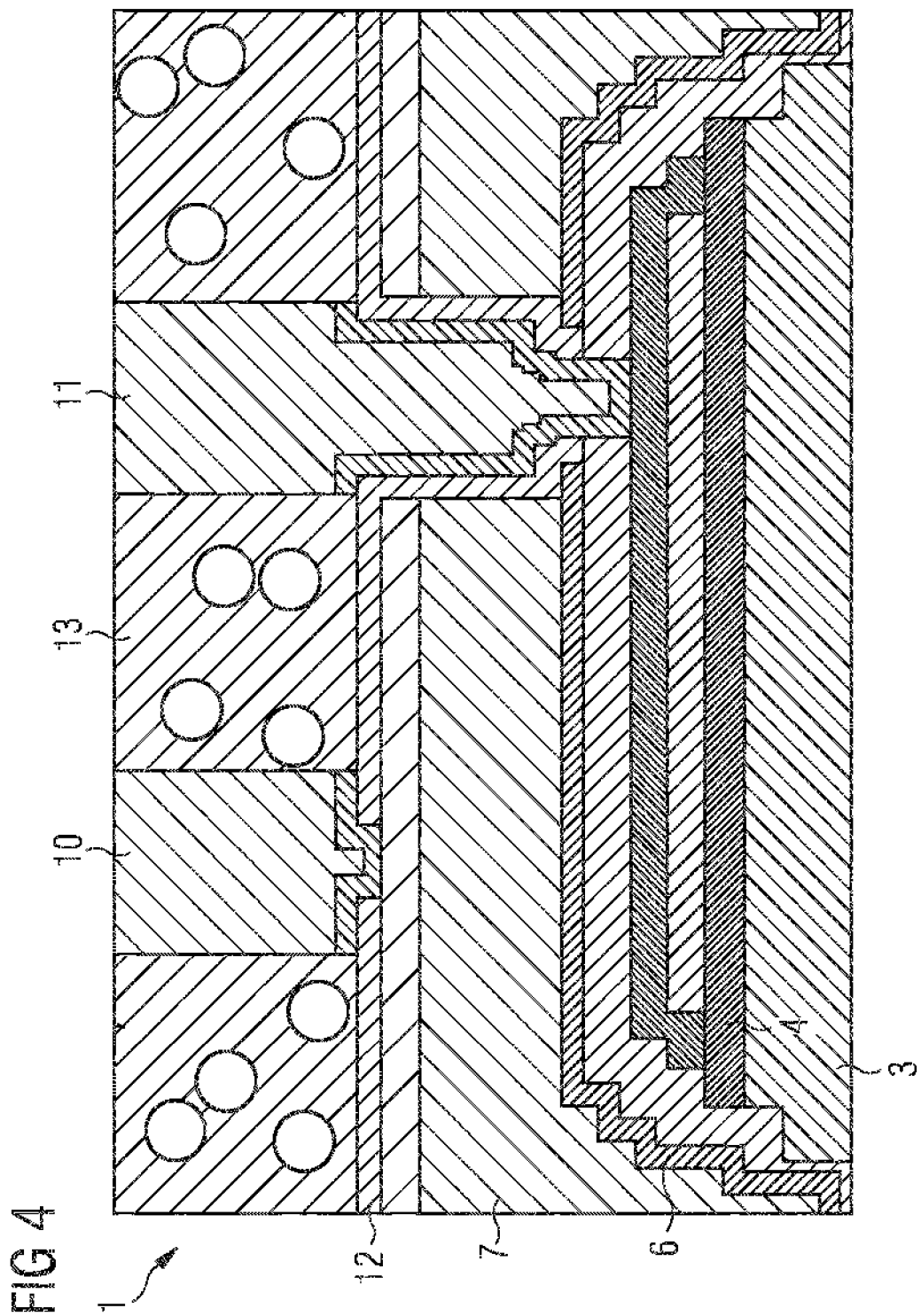
FIG. 4 shows a comparative example of a semiconductor component in a schematic cross-sectional view.

FIG. 4 shows a comparative example of a semiconductor component 1, which as a difference from the semiconductor component represented in FIG. 3 does not have a deformation layer 8. As a consequence, because of the rigidity of the carrier layer 7, defects, for example cracks and delaminations, may occur in the course of production or assembly and impair the mechanical stability of the semiconductor component 1.

Figure 5:
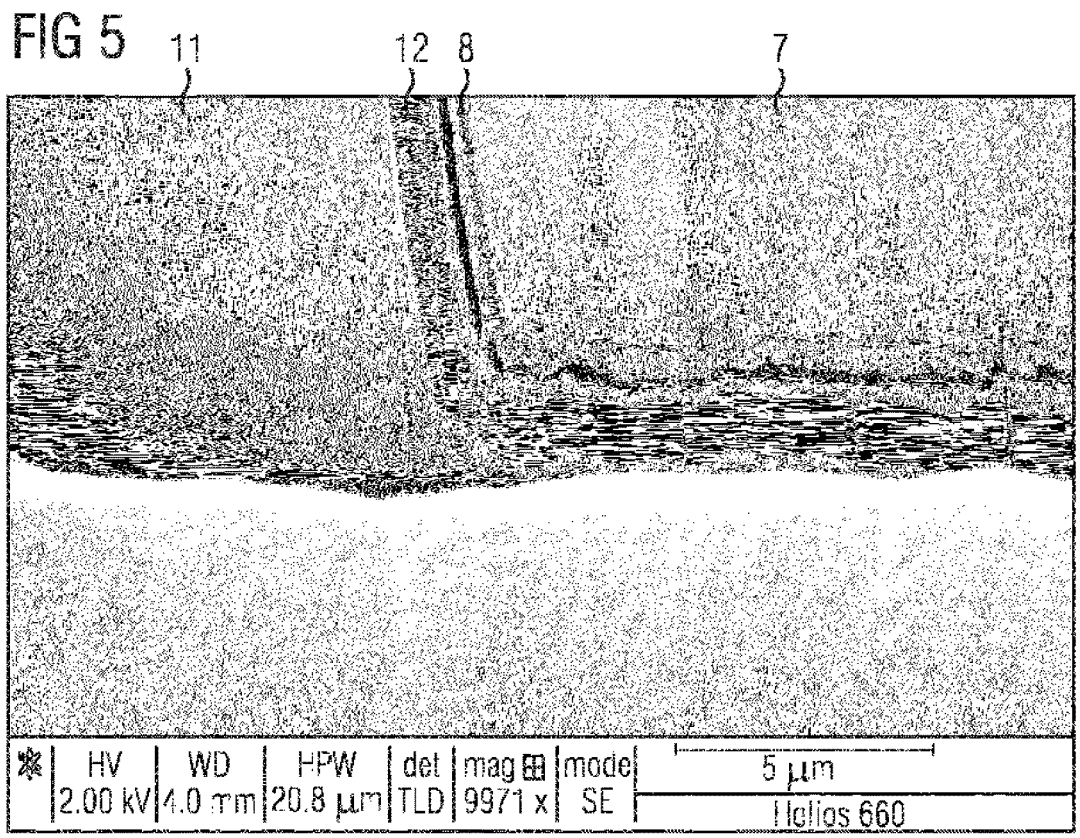
FIG. 5 shows an FIB (known as a focused ion beam) micrograph of a semiconductor component according to an embodiment.
Figure 6:
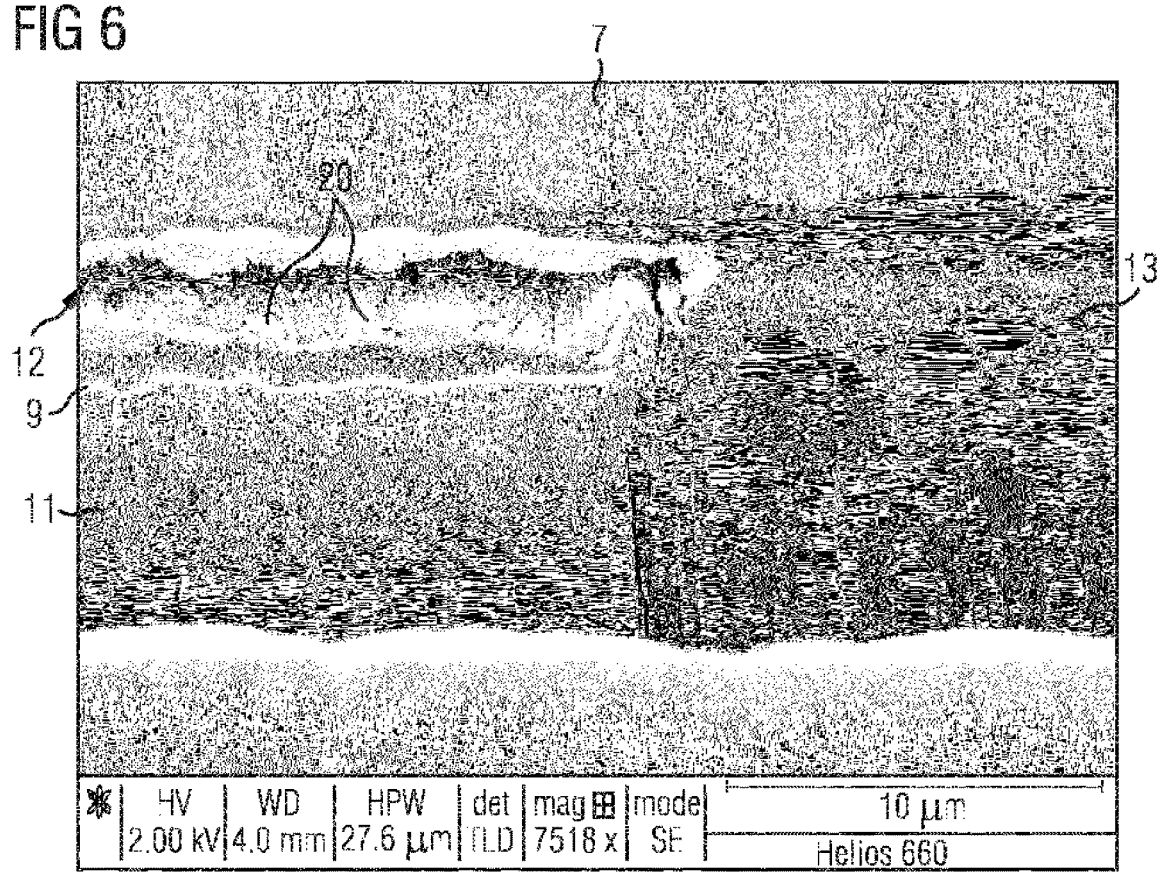
FIG. 6 shows an FIB (known as a focused ion beam) micrograph of a semiconductor component according to a comparative example.

FIG. 5 shows in an FIB micrograph a detail of the cross section of a semiconductor component, as represented in FIG. 3. Arranged between the insulating layer 12 and the carrier layer 7 is a deformation layer 8, which successfully prevents the occurrence of defects, such as for example cracks and delamination. FIG. 6, by contrast, shows in an FIB micrograph a detail of the cross section of a comparative example, as represented in FIG. 4, of a semiconductor component that does not have a deformation layer. The semiconductor component 1 exhibits defects 20 in the insulating layer 12, which can be prevented by the deformation layer 8.

The invention is not restricted by the description on the basis of the embodiments. Rather, the invention includes every novel feature and every combination of features, which includes in particular any combination of features in the patent claims, even if this feature or this combination itself is not explicitly specified in the patent claims or embodiments.

LIST OF REFERENCE SIGNS

1 Semiconductor component
1A, 1B Side face
2 Semiconductor body
2A First main face
2B Second main face
2C, 2D Side face
3 First semiconductor layer
3A Growth substrate
4 Second semiconductor layer
5 Active zone
6, 9 Starting layer
7 Carrier layer
7A Delimiting area
8 Deformation layer
8A, 8B Delimiting area
10 First terminal contact
11 Second terminal contact
12 Insulating layer
13 Main body
13A Surface
14 Terminal layer
15 Current spreading layer
16 Passivating layer
17, 18 Recess
19 Contact element
20 Defect
D1, D2 Thickness, total thickness
V Vertical direction
L Lateral directions

The invention claimed is:

1. A semiconductor component comprising:
   a semiconductor body having:
      a first semiconductor layer and a second semiconductor layer;
      a first main face and a second main face, opposite from the first main face, the first main face being formed by a surface of the first semiconductor layer and the second main face being formed by a surface of the second semiconductor layer;
      at least one side face joining the first main face to the second main face;
   an electrically conducting carrier layer covering the second main face at least in certain regions, and extending over the second main face to at least one side face of the semiconductor body; and
   an electrically conducting continuous deformation layer covering the second main face at least in certain regions, the electrically conducting continuous deformation layer having an elasticity that is identical to or higher than the electrically conducting carrier layer.

2. The semiconductor component as claimed in claim 1, wherein the electrically conducting continuous deformation layer being arranged on a side of the electrically conducting carrier layer that is facing away from the semiconductor body.

3. The semiconductor component as claimed in claim 1, wherein the electrically conducting carrier layer is conformally covered by the electrically conducting continuous deformation layer.

4. The semiconductor component as claimed in claim 1, wherein the electrically conducting continuous deformation layer is made thinner than the electrically conducting carrier layer; and wherein a thickness of the electrically conducting continuous deformation layer is at most half a thickness of the electrically conducting carrier layer.

5. The semiconductor component as claimed in claim 1, wherein the electrically conducting continuous deformation layer is for the greater part formed without any interruption.

6. The semiconductor component as claimed in claim 1, wherein the electrically conducting carrier layer and the electrically conducting continuous deformation layer are formed from different materials.

7. The semiconductor component as claimed in claim 1, wherein the electrically conducting continuous deformation layer is a metallic layer and comprises at least one material selected from the group consisting of Au, In, Cu, or combinations thereof.

8. The semiconductor component as claimed in claim 1, wherein the electrically conducting carrier layer is a metallic layer and comprises at least one material selected from the group consisting of Au, Zn, Al, Sn, Ni, Cu, AuSn, NiAu, NiPdAu, or combinations thereof.

9. The semiconductor component as claimed in claim 1, wherein the electrically conducting continuous deformation layer is a galvanic layer, a sputtered layer, or a vapor-deposited layer.

10. The semiconductor component as claimed in claim 1, wherein the semiconductor body has at least one recess extending from the second main face in the direction of the first main face and ends in the first semiconductor layer;

wherein the electrically conducting carrier layer is arranged in the at least one recess and electrically contacts the first semiconductor layer.

11. The semiconductor component as claimed in claim 1, wherein the electrically conducting continuous deformation layer has at least one recess, in which a terminal contact is arranged that electrically contacts the second semiconductor layer.

12. The semiconductor component as claimed in claim 1, further comprising
- a molded-on main body arranged on the semiconductor body; wherein the electrically conducting continuous deformation layer is arranged in a vertical direction between the semiconductor body and the main body.

13. A method for producing a semiconductor component as claimed in claim 1, wherein the method comprises:
  providing a semiconductor body having:
    a first semiconductor layer and a second semiconductor layer;
    a first main face and a second main face, opposite from the first main face, the first main face being formed by a surface of the first semiconductor layer and the second main face being formed by a surface of the second semiconductor layer;
    at least one side face joining the first main face to the second main face;
  applying an electrically conducting carrier layer to the second main face, the electrically conducting carrier layer extending from the second main face to at least one side face of the semiconductor body; and
  applying an electrically conducting continuous deformation layer to the second main face, the electrically conducting continuous deformation layer having an elasticity that is identical to or higher than the electrically conducting carrier layer.

14. The method as claimed in claim 13, further comprising removing a growth substrate, on which the first and second semiconductor layers are arranged, from the semiconductor body using a laser lifting process.

* * * * *